United States Patent
Hoskins

(10) Patent No.: US 8,742,797 B2
(45) Date of Patent: Jun. 3, 2014

(54) DOUBLE SWITCHED TRACK-AND-HOLD CIRCUIT

(75) Inventor: Michael J. Hoskins, Monument, CO (US)

(73) Assignee: Hittite Microwave Corporation, Chelmsford, MA (US)

(*) Notice: Subject to any disclaimer, the term of this patent is extended or adjusted under 35 U.S.C. 154(b) by 0 days.

(21) Appl. No.: 12/806,600

(22) Filed: Aug. 17, 2010

(65) Prior Publication Data

US 2011/0210764 A1 Sep. 1, 2011

Related U.S. Application Data

(60) Provisional application No. 61/339,148, filed on Mar. 1, 2010.

(51) Int. Cl.
*G11C 27/02* (2006.01)
*H03K 5/00* (2006.01)
*H03K 17/00* (2006.01)

(52) U.S. Cl.
USPC .......................................................... 327/94

(58) Field of Classification Search
USPC .................. 327/91, 94–97; 341/122–125
See application file for complete search history.

(56) References Cited

U.S. PATENT DOCUMENTS

| 6,552,577 | B1* | 4/2003 | Tam | 326/126 |
| 6,954,168 | B2* | 10/2005 | Hoskins | 341/155 |
| 7,248,082 | B2* | 7/2007 | Nakasha et al. | 327/91 |
| 7,782,096 | B2* | 8/2010 | Corsi et al. | 327/91 |
| 7,834,797 | B2* | 11/2010 | Iida et al. | 341/172 |
| 2006/0049881 | A1* | 3/2006 | Rein et al. | 331/74 |
| 2008/0136467 | A1* | 6/2008 | Tambouris et al. | 327/111 |
| 2008/0218257 | A1* | 9/2008 | Lee | 327/561 |
| 2011/0163899 | A1* | 7/2011 | Noguchi | 341/122 |

* cited by examiner

*Primary Examiner* — Quan Tra
(74) *Attorney, Agent, or Firm* — Iandiorio Teska & Coleman, LLP

(57) ABSTRACT

A double switched track-and-hold circuit includes an input buffer having a first switched amplifier circuit for passing an input signal in a track mode and isolating the input signal from a buffer output in a hold mode, and a track-and-hold core circuit responsive to the input buffer and having a second switched amplifier circuit for tracking the input signal in a track mode and isolating the input signal from a track-and-hold output in a hold mode. The first and second switching amplifier circuits turn off approximately simultaneously during the hold mode to provide enhanced isolation.

11 Claims, 4 Drawing Sheets

DOUBLE SWITCHED TRACK-AND-HOLD CIRCUIT

RELATED APPLICATIONS

This application claims benefit of and priority to U.S. Provisional Patent Application No. 61/339,148 filed on Mar. 1, 2010, under 35 U.S.C. §§119, 120, 363, 365, and 37 C.F.R. §§1.55 and 1.78, which is incorporated herein by reference.

GOVERNMENT RIGHTS

This invention was made with Government support under Contract No. DAAH01-99-C-R223, Modification No. P00005 awarded by the U.S. Army Aviation and Missile Command. The Government has certain rights in the invention.

FIELD OF THE INVENTION

This invention relates to track-and-hold circuits.

BACKGROUND OF THE INVENTION

Prior art track-and-hold circuits with very wide bandwidth suffer sample amplitude accuracy degradation due to the $2^{nd}$ order effects of non-linearity and hold-mode signal feed-through. This results from the design tradeoffs between these parameters. Designs that offer very wide bandwidth with high linearity tend to exhibit high levels of hold-mode signal feed-through resulting from poor switch off-state isolation.

One prior art track-and-hold circuit is disclosed in U.S. Pat. No. 6,954,168, which is incorporated herein by reference. The track-and-hold circuit disclosed in the '168 patent set new performance benchmarks for a track-and-hold circuit with 4 GHz of input bandwidth.

With the track-and-hold circuit of the '168 patent, the tradeoffs between bandwidth, linearity, hold-mode droop and hold-mode feed-through become more significant as the track-and-hold circuit bandwidth increases. To obtain high linearity, a typical switched emitter-follower (SEF) track-and-hold circuit requires large transistors in the emitter-follower of its switching circuit, but these large transistors increase capacitive loading and reduce the bandwidth of the driving stage. These larger transistors also result in a substantial off-state coupling capacitance to the hold capacitor contributing to substantial hold-mode feed-through. Hence, increased linearity in a switched emitter-follower track-and-hold circuit is usually obtained at the expense of bandwidth, droop, and hold-mode feed-through.

A larger bandwidth is also desired for existing track-and-hold circuits. A track-and-hold circuit with increased bandwidth also has general application to high-speed analog-to-digital conversion. The ability to convert signals at X-band (~10 GHz) is a common goal for several military systems. Hence, there is considerable interest in the military community in developing a track-and-hold circuit with 10 GHz, and larger, bandwidth.

BRIEF SUMMARY OF THE INVENTION

It is therefore an object of this invention to provide a track-and-hold circuit having a larger bandwidth.

It is a further object of this invention to provide such a track-and-hold circuit that provides enhanced switch off-state isolation.

It is a further object of this invention to provide such a track-and-hold circuit having high linearity.

The subject invention, however, in other embodiments, need not achieve all these objectives and the claims hereof should not be limited to structures or methods capable of achieving these objectives.

The invention results from the realization that a double switched track-and-hold circuit having a larger bandwidth, high linearity and providing enhanced isolation can be achieved by using an input buffer having a first switched amplifier circuit, and a track-and-hold core circuit responsive to the input buffer and including a second switched amplifier circuit, in which the first and second switching amplifier circuits both pass the input signal in a track mode and turn off approximately simultaneously during a hold mode to effectively isolate the input signal from the output.

This invention relates to an improved track-and-hold circuit that provides a very large input bandwidth and fast sampling speed while maintaining good sample accuracy. The design preferably includes a novel switched input buffer amplifier stage, driving the main emitter-follower switch that provides low output impedance in track-mode to achieve high bandwidth. In the hold-mode, the input buffer stage is switched off, along with the main switch, thus providing two stages of switch isolation and very low signal fed-through. Clamping diodes are preferably also incorporated into the output of the switched buffer amplifier to further increase the off-state isolation. The circuit provides ultra-wide input bandwidth and sampling aperture bandwidth while achieving low levels of sample nonlinearity and hold-mode signal feed-through.

In one embodiment, the subject invention features a double switched track-and-hold circuit, including: an input buffer having a first switched amplifier circuit for passing an input signal in a track mode and isolating the input signal from a buffer output in a hold mode, and a track-and-hold core circuit responsive to the input buffer and having a second switched amplifier circuit for tracking the input signal in a track mode and isolating the input signal from a track-and-hold output in a hold mode, the first and second switching amplifier circuits turning off approximately simultaneously during the hold mode to provide enhanced isolation.

In a preferred embodiment, the input buffer further includes a clamping circuit for clamping the output signal during the hold mode and for diverting current from the first switched amplifier circuit in the hold mode. The clamping circuit may include at least one diode. The input signal may be a differential signal. The switched amplifier circuits may each include an emitter follower amplifier circuit. The double switched track-and-hold circuit may further include an input amplifier stage. The input amplifier stage may include an emitter follower circuit. The input buffer may further include a second amplifier stage for amplifying the input signal responsive to the input amplifier circuit. The second amplifier stage may include a differential amplifier circuit. The first switched amplifier circuit may be responsive to the second amplifier stage. The double switched track-and-hold circuit may further include a current source for sinking current through the first switched amplifier circuit in the track mode and sinking current through the clamping circuit during the hold mode. The double switched track-and-hold circuit may further include a switched current source for sinking current from the first switched amplifier circuit during the hold phase to turn off the first switched amplifier circuit.

In another embodiment, the subject invention features a differential double switched track-and-hold circuit, including: an input buffer having a first differential switched amplifier circuit for passing an differential input signal in a track mode and isolating the input signal from a buffer output in a hold mode, and a track-and-hold circuit responsive to the input buffer and having a second differential switched amplifier circuit for tracking the input signal in a track mode and isolating the input signal from a track-and-hold output in a hold mode, the first and second differential switching amplifier circuits turning off approximately simultaneously during the hold mode to provide enhanced isolation.

In a preferred embodiment, the input buffer further includes a clamping circuit for clamping the buffer output signal during the hold mode and for diverting current from the first switched amplifier circuit in the hold mode. The clamping circuit may include two diodes. The switched amplifier circuits may each include two emitter follower amplifiers. The double switched track-and-hold circuit may further include an input amplifier stage. The input amplifier stage may include two emitter followers. The input buffer may further include a second amplifier stage responsive to the input amplifier stage for amplifying the input signal. The second amplifier stage may include a differential amplifier circuit. The first switched amplifier circuit may be responsive to the second amplifier stage. The double switched track-and-hold circuit may further include a current source for sinking current through the first switched amplifier circuit in the track mode and sinking current through the clamping circuit during the hold mode. The double switched track-and-hold circuit may further include a switched current source for sinking current from the first switched amplifier circuit during the hold phase to turn off the first switched amplifier circuit.

In yet another embodiment, the subject invention features an input buffer circuit, for a track-and-hold core circuit having a switched amplifier circuit for tracking the input signal in a track mode and isolating the input signal from a track-and-hold output in a hold mode, the buffer circuit including a switched amplifier circuit for passing an input signal in a track mode and isolating the input signal from a buffer output in a hold mode, and a clamping circuit for clamping the output signal during the hold mode and for diverting current from the switched amplifier circuit of the input buffer in the hold mode. The switching amplifier circuits of the input buffer and the track-and-hold circuit may turn off approximately simultaneously during the hold mode to provide enhanced isolation.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DESCRIPTION OF THE INVENTION

Figure 1:
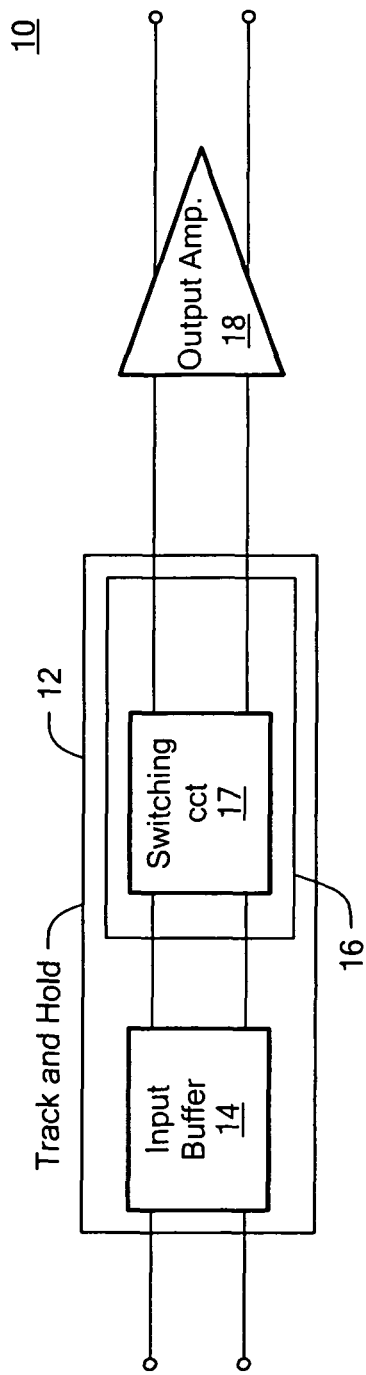
FIG. 1 is a block diagram showing a prior art track-and-hold circuit.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

A typical track-and-hold amplifier 10 is shown in FIG. 1 which includes a track-and-hold circuit 12 having an input buffer 14 and a core track-and-hold core circuit 16. Such a track-and-hold circuit is disclosed in the '168 patent described above. Track-and-hold core circuit 16 includes a switching circuit 17 for tracking the input signal in a track mode and isolating the input signal from a track-and-hold output in a hold mode. The output of circuit 12 is typically provided to an output amplifier 18 before the output may be sampled by an analog to digital converter. Circuit 12 is shown as being a differential circuit, but may also be a single ended circuit or capable of processing single ended signals.

As described above, with typical track-and-hold circuits the tradeoffs between bandwidth, linearity, hold-mode droop and hold-mode feed-through become more significant as the track-and-hold circuit bandwidth increases. Increased linearity in a switched emitter-follower track-and-hold circuit is usually obtained at the expense of bandwidth, droop, and hold-mode feed-through.

Figure 2:
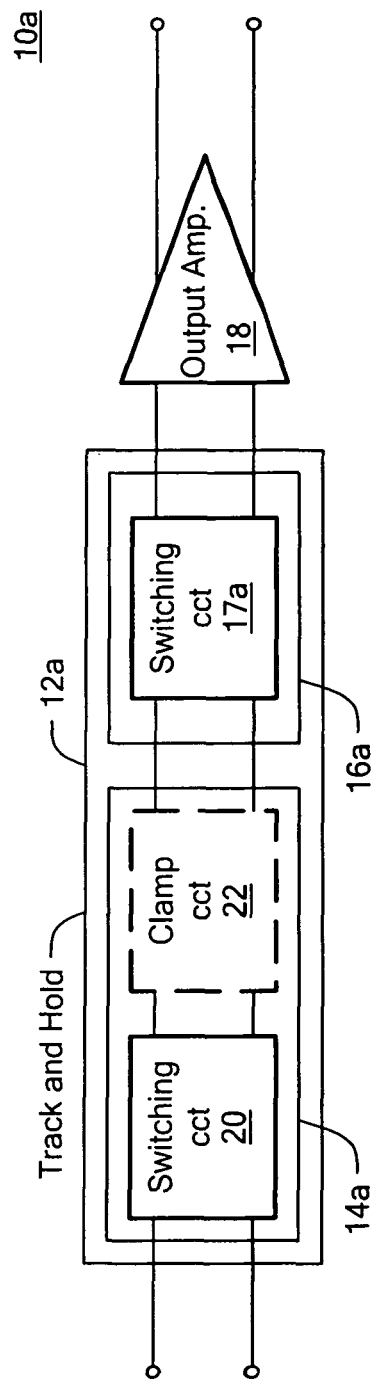
FIG. 2 is a block diagram showing a double switched track-and-hold circuit in accordance with the subject invention.

To realize the goals of larger bandwidth and enhanced switch off-state isolation, in accordance with the invention a double switched track-and-hold circuit 12a, FIG. 2, includes an additional switching circuit 20 added to the input buffer 14a for passing an input signal in a track mode and isolating the input signal from a buffer output in a hold mode. Preferably, switching circuits 17a and 20 are turned off approximately simultaneously during the hold mode to provide enhanced isolation. In one embodiment, input buffer 14a includes a clamping circuit 22 for clamping the output signal of the input buffer during the hold mode and for diverting current from switching circuit 20 in the hold mode.

Figure 3:
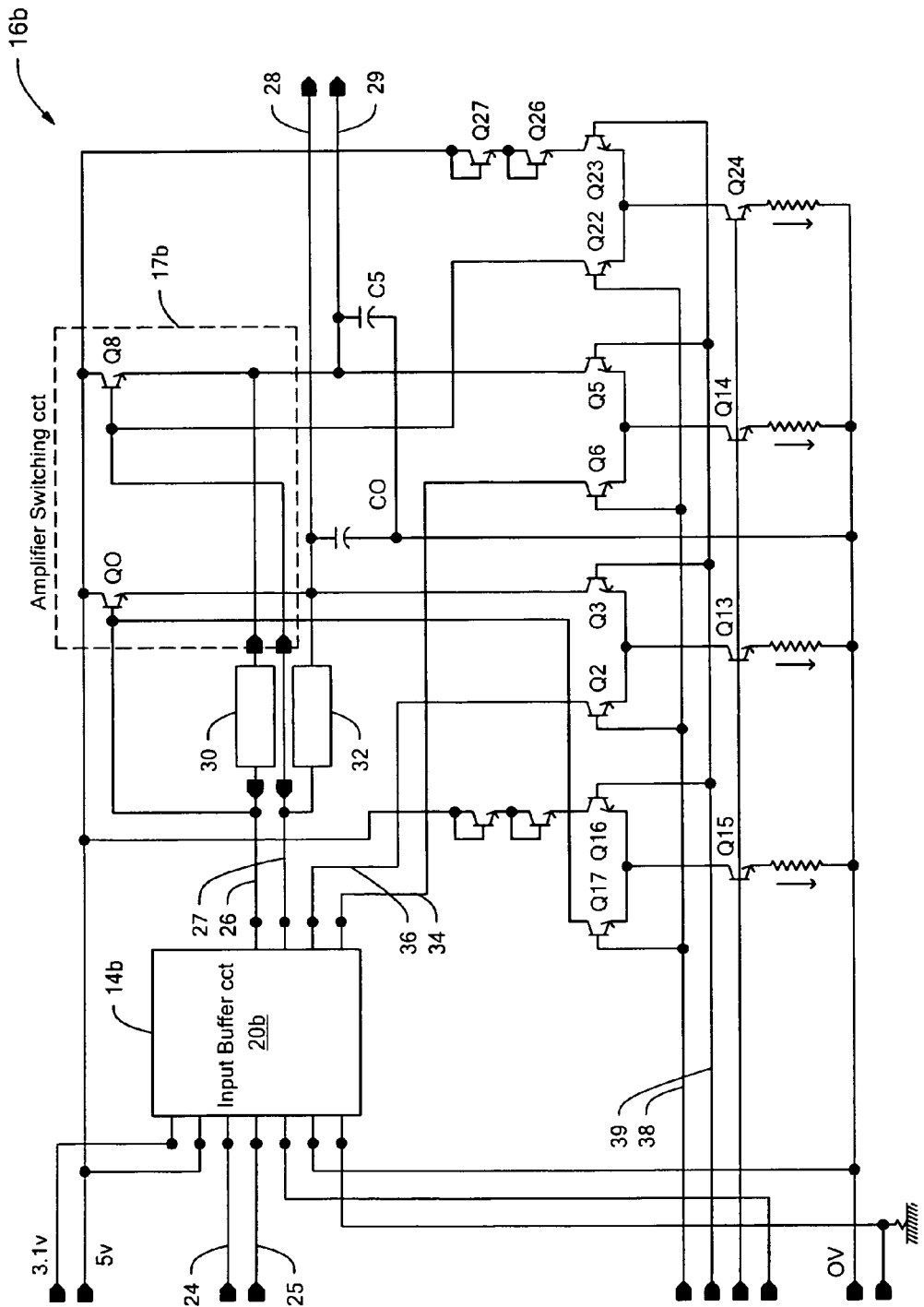
FIG. 3 is a schematic diagram of one embodiment of the double switched track-and-hold circuit of FIG. 2.
Figure 5:
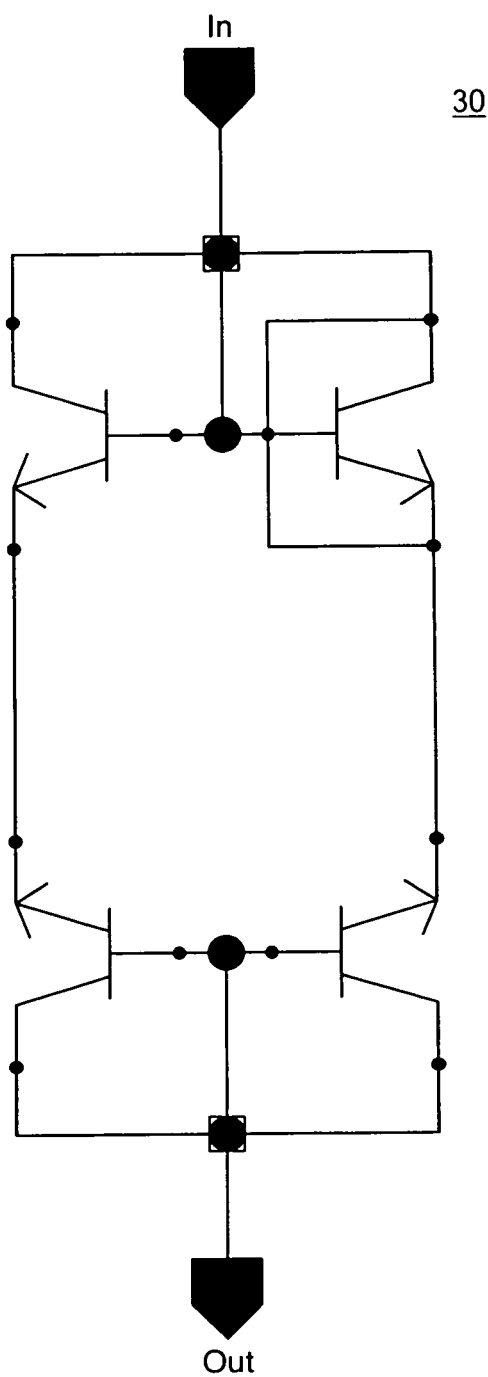
FIG. 5 is a schematic diagram of an exemplary feed-through compensation capacitor of FIG. 3.

Double switched track-and-hold circuit 12b is shown in more detail in FIG. 3. Input buffer amplifier 14b, which includes its own switching amplifier 20b, receives inputs on lines 24 and 25 and provides its outputs on lines 26 and 27. Input buffer amplifier 14b drives a pair of emitter-follower transistors Q0 and Q8 which function as switches for switching circuit 17b. Capacitors C0 and C5 are charge storage devices that sample the input signal in the track mode and provide a representation of the input voltage to the output in the hold mode. Circuits 30 and 32, shown in greater detail in FIG. 5, are feed-through compensation capacitors that emulate the off-state base-emitter capacitance of transistors Q0 and Q8 to cancel signal feed-through in the hold mode. The total hold capacitance of circuit 16b includes the capacitance from capacitors C0 and C5 and additional parasitics, which load the differential outputs 28 and 29.

Current switch transistors Q2, Q3, Q16, and Q17 provide current switching between the track-and-hold mode for transistor Q0, while transistors Q5, Q6, Q22, and Q23 provide current switching between the track-and-hold modes for transistor Q8. Transistors Q13-Q15 and Q24 each provide a current source for these switching transistors. To switch between the track-and-hold modes, clock input Clk_n drives current switch transistors Q2, Q6, Q17, and Q22 on line 38 and clock input Clk_p drives current switch transistors Q3, Q5, Q16, and Q23 on line 39.

In the track mode, transistors Q0 and Q8 function as typical emitter-follower amplifiers since transistors Q3 and Q5 are on and transistors Q2 and Q6 are off. In the hold mode, transistors Q3 and Q5 are turned off, thus turning off transistors Q0 and Q8 by floating their emitters. At the same time, the base voltages of transistors Q0 and Q8 are pulled down by the currents from current switches Q17 and Q16 and Q22 and Q23, respectively, to speed up the switching of transistors Q0 and Q8.

To turn off switching amplifier 20b of input buffer 14b, current switch transistors Q2 and Q6 provide sink currents on lines 34 and 36. In the hold mode, transistors Q2 and Q6 sink current on lines 34 and 36 to turn off switching amplifier 20b. In the track mode, transistors Q2 and Q6 float lines 34 and 36.

Figure 4:
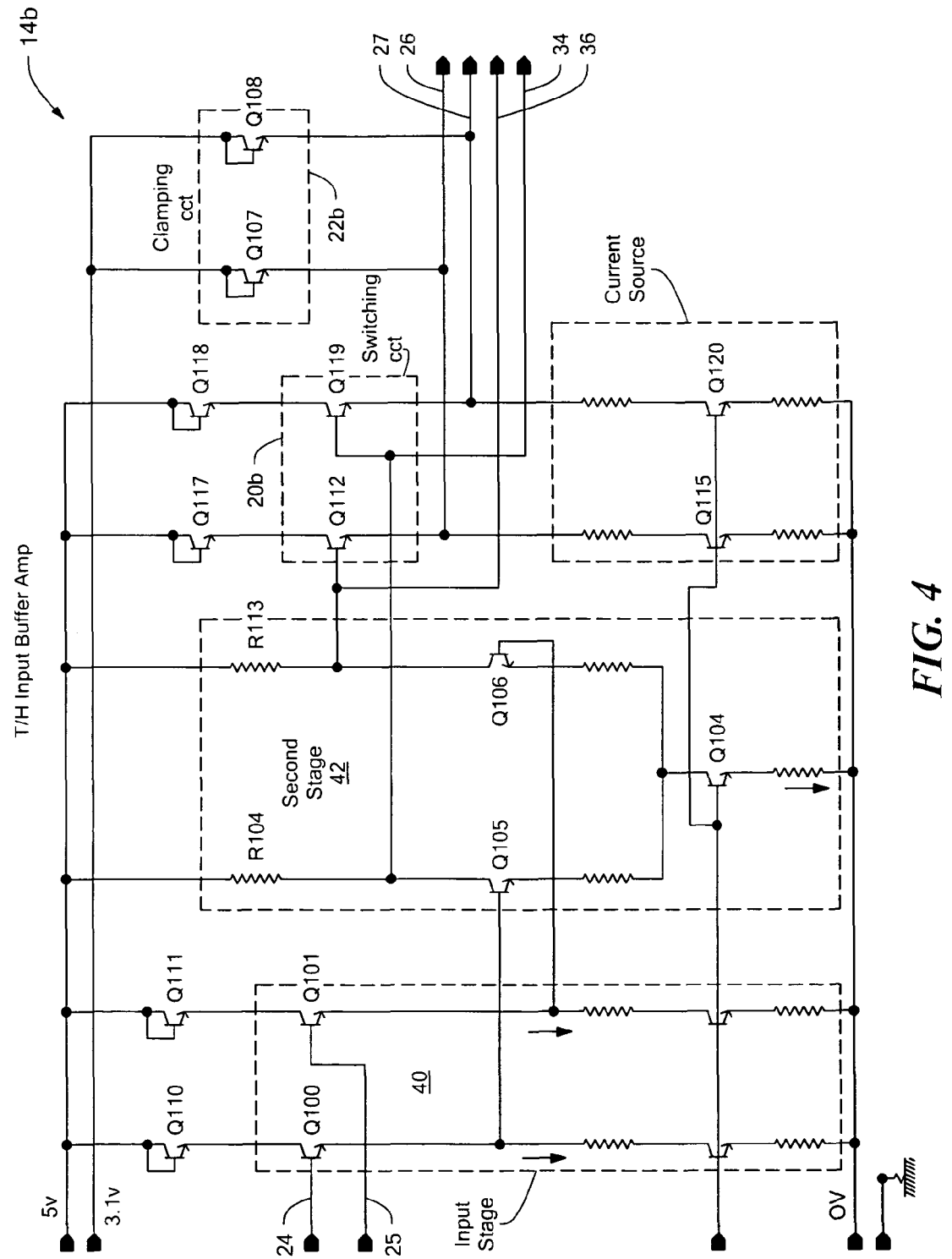
FIG. 4 is a schematic diagram of the switched input buffer of the double switched track-and-hold circuit of FIG. 3.

A more detailed schematic of input buffer circuit 14b is shown in FIG. 4. Input buffer 14b includes an input stage 40 which includes emitter-follower transistors Q100 and Q101, which drive transistors Q105 and Q106 in a differential amplifier 42 of input buffer 14b. Differential amplifier 42 also includes load resistors R104 and R113 and transistor Q104. Switching circuit 20b includes emitter-follower transistors Q112 and Q119 which are each coupled to differential amplifier 42. Clamping circuit 22b includes clamp diodes Q107 and Q108 which provide further feed-through rejection. Transistors Q115 and Q120 function as current sources and sink currents from switching transistors Q112 and Q119 in the track mode. Transistors Q110 and Q111, and transistors Q117 and Q118 provide a voltage drop from supply voltage Vp for input stage 40 and switching circuit 20b, respectively.

In the track mode, transistors Q112 and Q119 function as typical emitter-follower transistors and provide very low output impedance to drive the heavy capacitive load of circuit 16b. The bias voltage on clamp diodes Q107 and Q108 ensure that these diodes are off during the track mode to provide minimal loading on the output of input buffer 14b. As noted above, lines 34 and 36 are floating during track mode so they do not interfere with the operation of switching transistors Q112 and Q119 during this mode.

In the hold mode, lines 34 and 36 sink a substantial amount of current causing about a 1.1V additional common-mode voltage drop across load resistors R104 and R113. This voltage drop is reflected at the emitters of transistors Q112 and Q119 until their emitter voltage is clamped by clamp diodes Q107 and Q108 when they turn on. Once clamp diodes Q107 and Q108 turn on, the remainder of the voltage drop on the bases of transistors Q112 and Q119 turn these transistors off. When switching transistors Q112 and Q119 turn off, the sink current provided by transistors Q115 and Q120 begin to flow through clamp diodes Q107 and Q108 along with the current from current switch transistors Q17 and Q22 (shown in FIG. 3). This diversion of current through clamp diodes Q107 and Q108 fully turns the diodes on such that they provide very low shunt AC impedance. The clamp diodes then form an AC voltage divider with the high impedance provided by switching transistors Q112 and Q119 in their off state. The result is that the output of the input buffer provided on lines 26 and 27 is nulled, which provides substantial hold mode feed-through rejection.

Preferably, switching circuit 20b of FIG. 4 and switching circuit 17b of FIG. 3 turn off approximately simultaneously which insures that the sampling process retains a very large bandwidth.

The subject invention provides several new features relative to the prior track-and-hold circuits. First, the bandwidth is greatly increased by incorporating a switching amplifier in the input buffer that provides very low output impedance in the track-mode. This lower impedance provides enhanced bandwidth under the heavy capacitive loading effect of the switching transistors and feed-through compensation capacitors. Second, the feed-through problem is addressed by designing the input buffer such that it is switched off at the same time as the switching transistors Q0 and Q8, thus providing two stages of signal isolation. In addition, clamp diodes may be used in conjunction with the switched input buffer to further enhance feed-through rejection.

The subject invention realizes a large improvement in the design trade among bandwidth, linearity, and hold-mode signal feed-through and represents a major advancement relative to prior track-and-hold circuits. Embodiments of the subject invention are capable of realizing the goals of the 10+ GHz bandwidth requirements for X-band conversion in many military systems.

Aside from the preferred embodiment or embodiments disclosed above, this invention is capable of other embodiments and of being practiced or being carried out in various ways. For example, the circuits are shown as being differential circuits, but as described above, they may also be single ended circuits or capable of processing single ended signals. Also, the transistors are shown as BJT transistors, but this is not a limitation of the invention.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A high speed double switched track-and-hold circuit operable at sampling bandwidths greater than 10 GHz comprising:
   a track-and-hold core circuit including a switched amplifier circuit for tracking the input signal in a track mode and isolating the input signal from a track-and-hold output in a hold mode; and;
   an input buffer amplifier including:
   a differential amplifier stage,
   an additional switched amplifier circuit comprising a switchable emitter follower buffer coupled to the output of the differential amplifier stage and the track-and-hold core circuit,
   a clamping circuit coupled to outputs of the switchable emitter follower buffer configured to clamp a signal at the output of the input buffer amplifier during the hold mode and configured to divert current from the switchable emitter follower buffer in the hold mode, and
   the additional switched amplifier circuit in combination with the clamping circuit configured to provide minimal input capacitive loading, low output impedance in the track mode, and high output impedance in the hold mode to enable sampling bandwidths greater than 10 GHz and simultaneous switching of the track-and-hold core circuit and the switchable emitter follower to provide enhanced isolation.

2. The double switched track-and-hold circuit of claim 1 in which the clamping circuit includes at least one diode.

3. The double switched track-and-hold circuit of claim 1 in which the input signal is a differential signal.

4. The double switched track-and-hold circuit of claim 1 in which the switched amplifier circuits each include an emitter follower amplifier circuit.

5. The double switched track-and-hold circuit of claim 1 further including an input amplifier stage.

6. The double switched track-and-hold circuit of claim 5 in which the input amplifier stage includes an emitter follower circuit.

7. The double switched track-and-hold circuit of claim 5 in which the input buffer further includes a second amplifier stage for amplifying the input signal responsive to the input amplifier circuit.

8. The double switched track-and-hold circuit of claim 7 in which the second amplifier stage includes a differential amplifier circuit.

9. The double switched track-and-hold circuit of claim 7 in which the first switched amplifier circuit is responsive to the second amplifier stage.

10. The double switched track-and-hold circuit of claim 1 further including a current source for sinking current through the first switched amplifier circuit in the track mode and sinking current through the clamping circuit during the hold mode.

11. The double switched track-and-hold circuit of claim 1 further including a switched current source for sinking current from the first switched amplifier circuit during the hold phase to turn off the first switched amplifier circuit.

\* \* \* \* \*